(12) United States Patent
Enomoto

(10) Patent No.: US 12,021,001 B2
(45) Date of Patent: Jun. 25, 2024

(54) SEMICONDUCTOR MODULE AND MANUFACTURING METHOD OF SEMICONDUCTOR MODULE

(71) Applicant: Fuji Electric Co., Ltd., Kanagawa (JP)

(72) Inventor: Kazuo Enomoto, Nagano (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 309 days.

(21) Appl. No.: 17/365,279

(22) Filed: Jul. 1, 2021

(65) Prior Publication Data
US 2022/0068743 A1    Mar. 3, 2022

(30) Foreign Application Priority Data
Aug. 27, 2020 (JP) ................. 2020-143970

(51) Int. Cl.
*H01L 23/31* (2006.01)
*H01L 21/48* (2006.01)
*H01L 21/56* (2006.01)
*H01L 23/29* (2006.01)
(Continued)

(52) U.S. Cl.
CPC ...... *H01L 23/3142* (2013.01); *H01L 21/4882* (2013.01); *H01L 21/56* (2013.01); *H01L 23/293* (2013.01); *H01L 23/3675* (2013.01); *H01L 23/49822* (2013.01)

(58) Field of Classification Search
CPC . H01L 23/3142; H01L 21/4882; H01L 21/56; H01L 23/293; H01L 23/3675; H01L 23/49822; H01L 23/02; H01L 23/04; H01L 23/043; H01L 23/045; H01L 23/047; H01L 23/053; H01L 23/057; H01L 23/31; H01L 23/3157
See application file for complete search history.

(56) References Cited

U.S. PATENT DOCUMENTS

| 5,606,200 | A  | * | 2/1997 | Haraguchi | ............. | H01L 23/24 |
| | | | | | | 257/788 |
| 9,373,558 | B2 | * | 6/2016 | Tsuyuno | ............... | H01L 23/291 |
| 10,483,176 | B2 | * | 11/2019 | Oya | .................... | H01L 25/072 |

(Continued)

FOREIGN PATENT DOCUMENTS

| JP | H11-307658 A | 11/1999 |
| JP | 2000-323593 A | 11/2000 |
| JP | 2004-103846 A | 4/2004 |

*Primary Examiner* — Eduardo A Rodela
(74) *Attorney, Agent, or Firm* — CHEN YOSHIMURA LLP

(57) ABSTRACT

A semiconductor module includes a heat dissipating plate; an insulating substrate disposed on an upper surface of the heat dissipating plate; a semiconductor element disposed an upper surface of the insulating substrate; a frame-shaped case bonded to the upper surface of the heat dissipating plate via an adhesive so as to surround peripheries of the insulating substrate and the semiconductor element; and a sealing resin that fills an inner space defined by the frame-shaped case and the heat dissipating plate so as to seal the insulating substrate and the semiconductor element, wherein at an interface between the heat dissipating plate and the frame-shaped case, a recess communicating with the inner space is formed in at least one of the frame-shaped case and the heat dissipating plate, and the sealing resin is filled in the recess.

7 Claims, 13 Drawing Sheets

(51) Int. Cl.
*H01L 23/367* (2006.01)
*H01L 23/498* (2006.01)

(56) References Cited

U.S. PATENT DOCUMENTS

2006/0061971 A1\* 3/2006 Inoue ..................... H01L 23/04
  257/E23.181
2020/0219782 A1\* 7/2020 Hitomi ................ H01L 21/4817

\* cited by examiner

SEMICONDUCTOR MODULE AND MANUFACTURING METHOD OF SEMICONDUCTOR MODULE

BACKGROUND OF THE INVENTION

Technical Field

The present invention relates to a semiconductor module and a method for manufacturing a semiconductor module.

Background Art

The semiconductor device has a substrate provided with semiconductor elements such as an IGBT (Insulated Gate Bipolar Transistor), a power MOSFET (Metal Oxide Semiconductor Field Effect Transistor), and an FWD (Free Wheeling Diode), and is used for an inverter device or the like. (See Patent Documents 1-3).

In Patent Documents 1-3, a semiconductor element is arranged in the center of the upper surface of a metal base plate (heat dissipating plate) via an insulating substrate. Further, a resin case is arranged on the upper surface of the metal base plate so as to surround the semiconductor element. For example, the resin case is formed in a frame shape along the outer shape of the metal base plate.

RELATED ART DOCUMENT

Patent Document

Patent Document 1: Japanese Patent Application Laid-Open Publication No. H11-307658
Patent Document 2: Japanese Patent Application Laid-Open Publication No. 2000-323593
Patent Document 3: Japanese Patent Application Laid-Open Publication No. 2004-103846

SUMMARY OF THE INVENTION

In the above-mentioned semiconductor device, there is a possibility that a crack may occur at the interface between the metal base plate and the resin case due to the temperature cycle accompanying the device operation. If the cracks extend to the semiconductor element, heat cannot be sufficiently dissipated, which may eventually lead to shortening of the life of the device.

The present invention has been made in view of the above points, and one of the objects of the present invention is to provide a semiconductor module capable of suppressing the occurrence of cracks at the edges of the case and realizing a long life, and a method for manufacturing such a semiconductor module.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor module, including: a heat dissipating plate; an insulating substrate disposed on an upper surface of the heat dissipating plate; a semiconductor element disposed an upper surface of the insulating substrate; a frame-shaped case bonded to the upper surface of the heat dissipating plate via an adhesive so as to surround peripheries of the insulating substrate and the semiconductor element; and a sealing resin that fills an inner space defined by the frame-shaped case and the heat dissipating plate so as to seal the insulating substrate and the semiconductor element, wherein at an interface between the heat dissipating plate and the frame-shaped case, a recess communicating with the inner space is formed in at least one of the frame-shaped case and the heat dissipating plate, and the sealing resin is filled in the recess.

In another aspect, the present disclosure provides a method for manufacturing a semiconductor module including a heat dissipating plate, an insulating substrate disposed on an upper surface of the heat dissipating plate, and a semiconductor element disposed on an upper surface of the insulating substrate, the method including: a case joining step of bonding a frame-shaped case to the upper surface of the heat dissipating plate so as to surround the insulating substrate and the semiconductor element via an adhesive; and a sealing step of filling an inner space defined by the frame-shaped case and the heat dissipating plate with a sealing resin so as to seal the insulating substrate and the semiconductor element, wherein at an interface between the heat dissipating plate and the frame-shaped case, a recess communicating with the inner space is formed in at least one of the frame-shaped case side and the heat dissipating plate, and the sealing resin is filled in the recess in the sealing step.

In the semiconductor modules according to at least some of the aspects of the present invention, the occurrence of cracks at the edges of the case can be suppressed and the product life can be extended.

It is to be understood that both the foregoing general description and the following detailed description are exemplary and explanatory, and are intended to provide further explanation of the invention as claimed.

DETAILED DESCRIPTION OF EMBODIMENTS

Figure 1A:
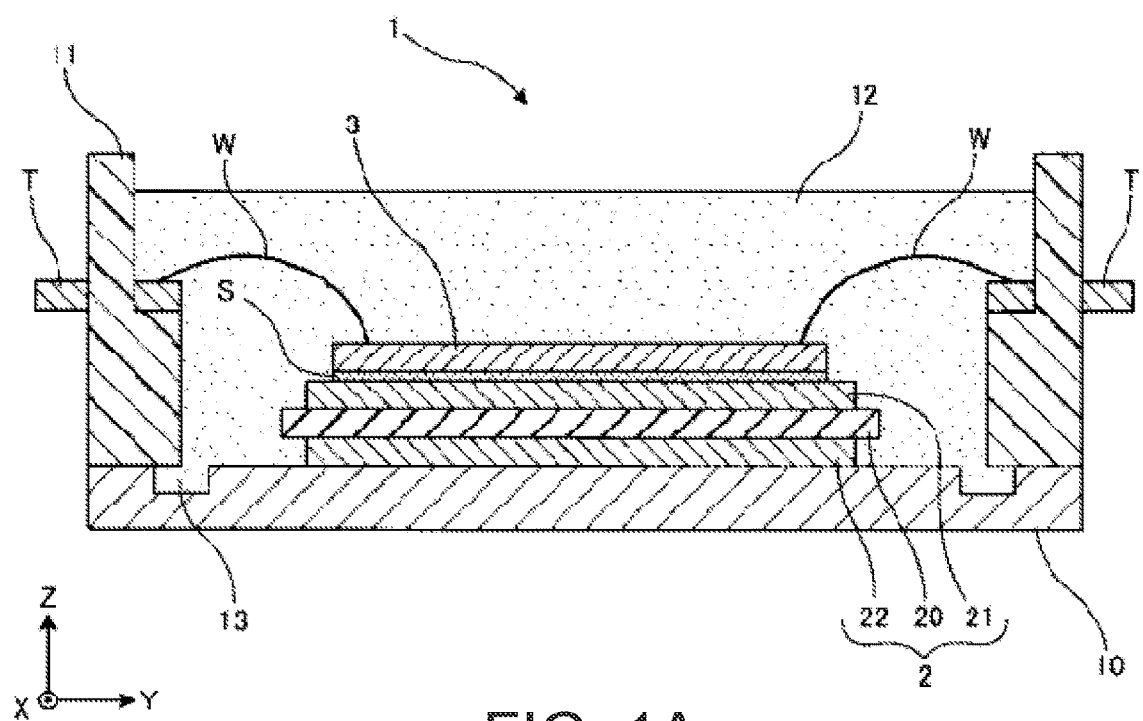
FIGS. 1A-1B are cross-sectional views of an example of a semiconductor module according to an embodiment of the present invention.
Figure 1B:
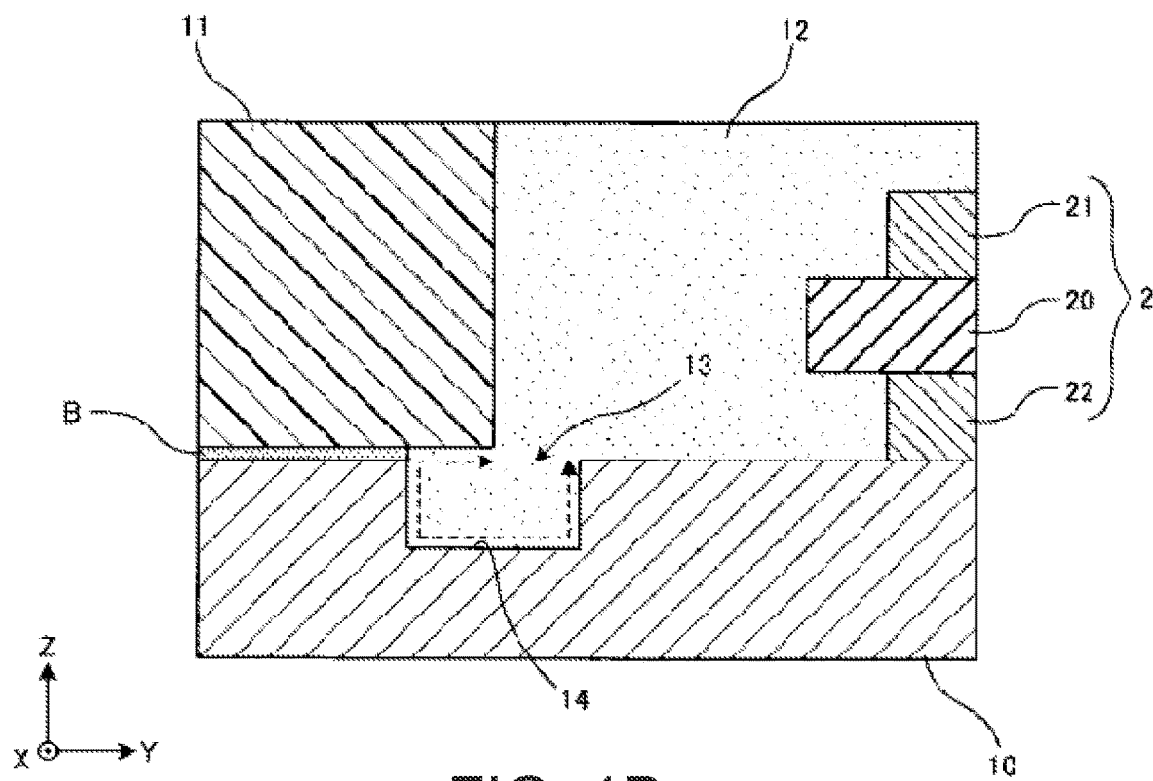
Figure 2A:
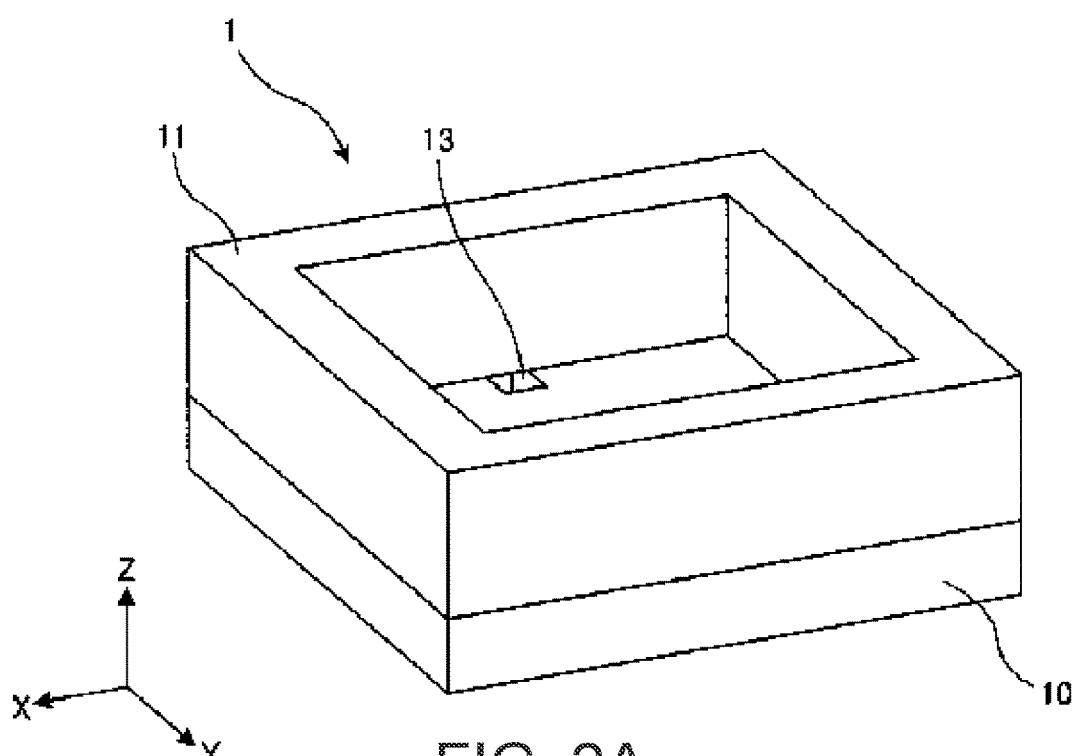
FIGS. 2A-2B are perspective views of the example of the semiconductor module according to the embodiment of the present invention
Figure 2B:
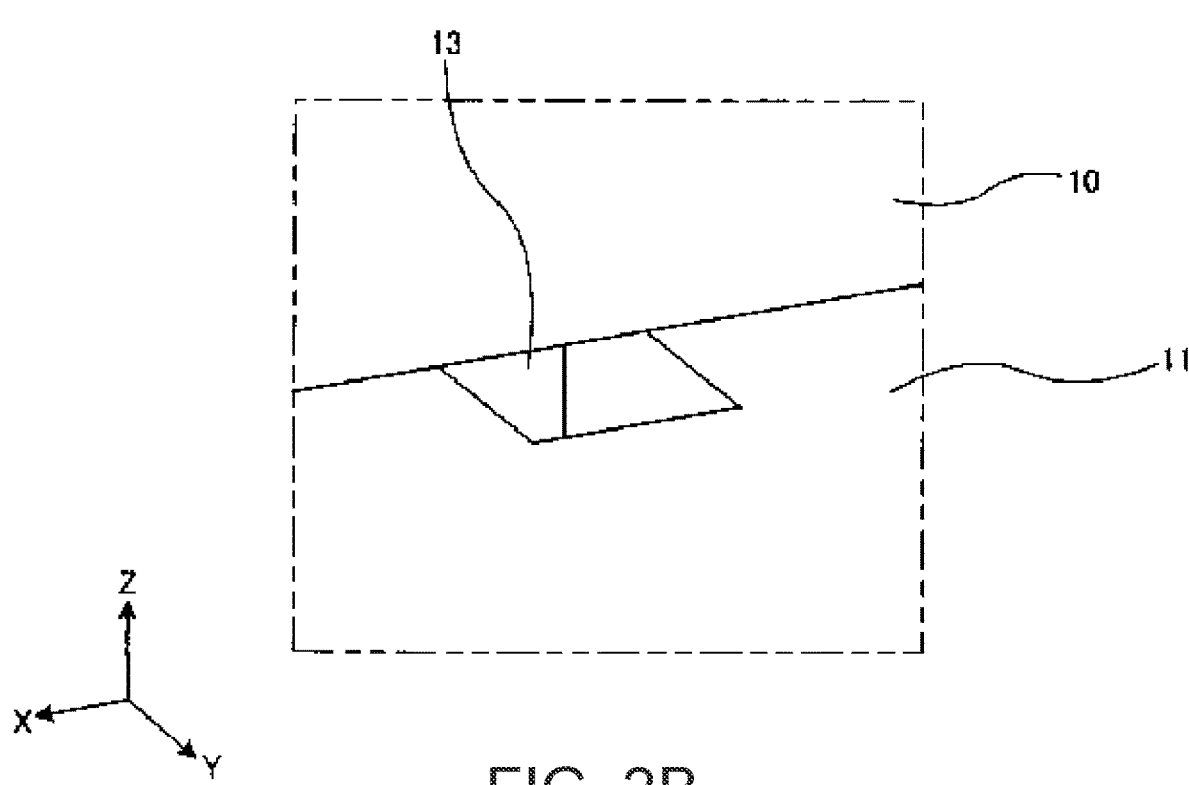

Hereinafter, the semiconductor module to which the present invention can be applied will be described. FIGS. 1A-1B are cross-sectional views showing an example of a semiconductor module according to an embodiment of the present invention. Specifically, FIG. 1A is a cross-sectional view of the entire semiconductor module, and FIG. 1B is a partially enlarged view at the interface between the case and the heat dissipating plate. FIGS. 2A-2B are perspective views of the example of the semiconductor module according to the present embodiment. Specifically, FIG. 2A is a perspective view of the entire module that includes the case and the heat dissipating plate, and FIG. 2B is a partially enlarged view of FIG. 2A. Here, the semiconductor modules of this and other embodiments shown below are merely examples, and the modules are not limited to these and can be changed as appropriate.

In the following figures, the longitudinal direction of the semiconductor module is defined as the X direction, the lateral direction is defined as the Y direction, and the height direction is defined as the Z direction. In some cases, the X direction may be referred to as a front-rear direction, the Y direction may be referred to as a left-right direction, and the Z direction may be referred to as a vertical direction. These directions (front-back, left-right, up-down directions) are terms used for convenience of explanation, and the correspondence with each of the XYZ directions may change depending on the mounting posture of the semiconductor module. Further, in the present specification, a plan view means a case where the upper surface of the semiconductor module is viewed from above.

The semiconductor module 1 of this embodiment is applied to a power conversion device such as a power module. As shown in FIGS. 1A-1B, the semiconductor module 1 of this embodiment includes a heat dissipating plate 10, an insulating substrate 2 arranged on the heat dissipating plate 10, a semiconductor element 3 mounted on the insulating substrate 2 via a bonding material S, and an insulating substrate 2. A case 11 for accommodating the semiconductor element 3 and a sealing resin 12 for filling the inner space of the case 11 are also provided.

The heat dissipating plate 10 is a rectangular-shaped (in a plan view) plate made of, for example, copper, aluminum or an alloy thereof, or a composite material such as magnesium and silicon carbide, or aluminum and silicon carbide, and functions as a heat radiating plate that radiates/dissipates heat from the insulating substrate 2 and the electronic components mounted on the insulating substrate 2 to the outside. The heat dissipating plate 10 may be called a base plate. Further, the heat dissipating plate 10 may form a part of a cooler, and fins may be formed on the back surface (lower surface) thereof.

The case 11 is a rectangular frame-shaped resin frame body that follows the outer shape of the heat dissipating plate 10, and is bonded to, for example, the heat dissipating plate 10 with an adhesive B or the like. A lid (not shown) may be provided at the upper part of the case 11. The inner space surrounded by the heat dissipating plate 10 and the case 11 is filled with the sealing resin 12. The case 11 is made of a thermoplastic resin. Examples of such a resin include PPS resin (polyphenylene sulfide resin) and PBT resin (polybutylene terephthalate resin). Further, a filler such as ceramics may be added to the resin.

Further, terminal members T for external connection are embedded in the case 11. The terminal member T is formed by pressing a metal plate such as a copper material, a copper alloy material, an aluminum alloy material, or an iron alloy material. One end of the terminal member T is located inside the case 11, and the other end of the terminal member T projects to the outside of the case 11.

Further, upper electrodes of the semiconductor element 3, which will be described later, and the terminal members T are electrically connected by wiring members W such as wires. The wiring member W is composed of, for example, a bonding wire. As the material of the wire, any one of gold, copper, aluminum, gold alloy, copper alloy, aluminum alloy or a combination thereof can be used. It is also possible to use a member other than the wire as the wiring member T. For example, a ribbon can be used as the wiring member T. Further, the wiring member T is not limited to a wire or the like, and may be formed of a metal plate made of a copper material, a copper alloy material, an aluminum alloy material, or an iron alloy material.

The adhesive B is interposed between the outer periphery of the upper surface of the heat dissipating plate 10 and the lower surface of the case 11, and plays a role of adhering the heat dissipating plate 10 and the case 11. As the adhesive B, for example, an epoxy-based adhesive or a silicone-based adhesive is preferable. Such an adhesive B has an elastic modulus of 0.1 GPa or more and 10 GPa or less. The adhesive B contains 30 vol % or less of a filler or does not contain any filler.

The sealing resin 12 fills the internal space of the case 11 defined by the frame-shaped case 11. As a result, the insulating substrate 2, the semiconductor element 3 mounted on the insulating substrate 2, and the wiring member W are sealed in the above-mentioned space. The sealing resin 12 is made of a thermosetting resin. The sealing resin 12 preferably contains at least one of epoxy, silicone, urethane, polyimide, polyamide, and polyamideimide. For example, an epoxy resin mixed with a filler is suitable in terms of insulation, heat resistance, and heat dissipation. Such a sealing resin 12 has a coefficient of thermal expansion of 7 ppm/K or more and 30 ppm/K or less, and an elastic modulus of 7 GPa or more and 30 GPa or less. The sealing resin 12 contains 20 vol % or more and 90 vol % or less of the filler. Further, the elastic modulus of the sealing resin 12 is preferably larger than the elastic modulus of the adhesive B. Further, it is preferable that the filler content of the sealing resin 12 is higher than that of the adhesive B.

The insulating substrate 2 is composed of, for example, a DCB (Direct Copper Bonding) substrate, an AMB (Active Metal Brazing) substrate, or a metal base substrate. Specifically, the insulating substrate 2 has an insulating plate 20, a circuit plate 21 arranged on the upper surface of the insulating plate 20, and a metal plate 22 arranged on the lower surface of the insulating plate 20. The insulating substrate 2 is formed into, for example, a rectangular shape in a plan view.

The insulating plate 20 has a predetermined thickness in the Z direction and is formed in a flat plate shape having an upper surface and a lower surface. The insulating plate 20 is made of an insulating material, such as, for example, a ceramic material such as alumina (Al$_2$O$_3$), aluminum nitride (AlN), and silicon nitride (Si$_3$N$_4$), a resin material such as epoxy, or an epoxy resin material using a ceramic material as a filler.

The circuit board 21 is formed of a metal layer such as copper foil. Further, a plating layer such as nickel may be formed on the surface. In the present embodiment, for convenience, only one circuit board 21 is shown, but multiple circuit boards 21 may be formed on the upper surface of the insulating plate 20. Also, a plurality of circuit boards 21 may be formed in island shapes on the insulating plate 20 in a state of being electrically insulated from each other, for example.

The metal plate 22 has a predetermined thickness in the Z direction and is formed so as to cover the lower surface of the insulating plate 20. The metal plate 22 is formed of a metal plate having good thermal conductivity such as copper or aluminum. Further, a plating layer such as nickel may be formed on the surface.

A semiconductor element 3 is arranged on the upper surface of the circuit board 21 via a bonding material S such as solder. The semiconductor element 3 is formed in a rectangular shape in a plan view. In FIG. 1A, for convenience, a single semiconductor element 3 is shown for a single circuit board 21, but multiple semiconductor elements 3 may be arranged on the single circuit board 21.

The semiconductor element 3 is formed in a square or rectangular shape in a plan view by way of a semiconductor substrate made of silicon carbide (SiC), gallium nitride (GaN), or diamond, for example.

As the semiconductor element 3, switching elements such as IGBT (Insulated Gate Bipolar Transistor) and power MOSFET (Metal Oxide Semiconductor Field Effect Transistor), and diodes such as FWD (Free Wheeling Diode) are used. Further, as the semiconductor element 3, an RC (Reverse Conducting)-IGBT element in which an IGBT and an FWD are integrated, a power MOSFET element, an RB (Reverse Blocking)-IGBT having a sufficient withstand voltage against a reverse bias, or the like may be used.

In addition, the shape, number of arrangements, arrangement locations, and the like of the semiconductor element 3 can be changed as appropriate. The semiconductor element 3 in the present embodiment is a vertical switching element in which a functional element such as a transistor is formed in a semiconductor substrate, but the present invention is not limited to this, and a horizontal switching element may be used instead.

By the way, in a semiconductor module general, the heat dissipating plate and the case may be joined and cemented together with a resin adhesive, or with a combination of an adhesive and the screw fastening. In either way, the case functions as:

(1) a housing that accommodates a semiconductor element and protects the semiconductor element from electrical or mechanical external forces.

(2) a terminal base for electrically connecting the semiconductor element, which is the heart of a semiconductor module, and an external device.

However, the conventional joining technique of the heat dissipating plate and the case has many issues in terms of product cost and product life.

For example:

(1) When fastening screws, it is necessary to embed a nut corresponding to the screws in the case. Therefore, the shape of the case becomes complicated, which causes an increase in the manufacturing cost of the case. Further, in the case of screw fastening, not only equipment for fastening is required in the module assembly process, but also the screw itself becomes a factor of cost increase.

(2) When joining with an adhesive, the adhesion between the heat dissipating plate and the case is weak, and the joining force is weaker than that of screw fastening. This is because the heat dissipating plate is made of metal, while the case is made of resin, and the different materials are joined to each other. That is, in the case of using an adhesive, the function as a housing is inferior to that of screw fastening in terms of device life.

As described above, the adhesion between the metal surface and the resin surface is lower than the adhesion between the resins. Therefore, the heat dissipating plate and the case may be peeled off at the interface therebetween due to a change in the ambient temperature during module operation or a temperature cycle due to heat generated by the module itself. Also, an insulating substrate is arranged in the inner space of the case. Moisture may infiltrate into the peeled portion from the outside as the peeling progresses at the interface between the heat dissipating plate and the insulating substrate. As a result, the insulation performance and heat dissipation performance are deteriorated, and the life of the entire module is shortened.

Therefore, the inventor of the present invention came up with the present invention by paying attention to the adhesion between the heat dissipating plate and the case when the heat dissipating plate and the case are joined with an adhesive. Specifically, in the present embodiment, the frame-shaped case 11 is formed so as to surround the insulating substrate 2 and the semiconductor element 3. The case 11 is joined to the upper surface of the heat dissipating plate 10 via an adhesive B. More specifically, the bottom surface of the case 11 is joined to the upper surface of the outer peripheral edge portion of the heat dissipating plate 10 via the adhesive B. The inner space of the case 11 is filled with the sealing resin 12. The insulating substrate 2 and the semiconductor element 3 are sealed with the sealing resin 12.

In particular, in the present embodiment, a recess 13 that is recessed at least on the case 11 side or the heat dissipating plate 10 side is formed at the interface between the heat dissipating plate 10 and the case 11. For example, in FIGS. 1A-1B and 2A-2B, a recess 13 is recessed in the front surface of the heat dissipating plate 10 toward the back surface of the heat dissipating plate 10 at a position that faces a part of the inner peripheral edge of one side of the frame-shaped case 11. More specifically, in a plan view, the recess 13 is provided in the front surface of the heat dissipating plate 10 at a position overlapping the inner peripheral edge of the case 11. The recess 13 is filled with a sealing resin 12.

As shown in FIG. 1B, according to this configuration, the recess 13 forms an interface 14 in which the sealing resin 12 comes into contact with the end faces of the heat dissipating plate 10 and the case 11. The interface 14 is formed so as to follow the respective end faces of the heat dissipating plate 10 and the case 11 in a cross-sectional view. Therefore, the area of the interface 14 in contact with the sealing resin 12 is expanded by the recess 13. Therefore, the adhesion between the heat dissipating plate 10 and the case 11 can be ensured not only by the adhesive B but also by the sealing resin 12 that has entered the recess 13. That is, the recess 13 can improve the anchor effect between the heat dissipating plate 10 and the case 11.

Therefore, it is possible to secure a sufficient bonding force only by bonding with the adhesive B without using screw fastening, and it is possible to suppress the occurrence of cracks on the end face of the case with a relatively inexpensive configuration and can extend the life of the entire semiconductor module 1.

In the present embodiment, the recess 13 is formed in a rectangular shape in both a plan view and a cross-sectional view; that is, the recess 13 is formed in a rectangular parallelepiped shape in both cross-sections. But the present invention is not limited to this configuration; the recess 13 is not limited to a rectangular parallelepiped shape, and may be formed into, for example, a circular shape, an elliptical shape, or another polygonal shape in a plan view. Here, the recess 13 is formed with a thickness deeper than the thickness of the adhesive B. Therefore, the recess 13 is not filled with the adhesive B. Further, in the present embodiment, the recess 13 is formed at a predetermined depth so as to leave a thickness of the heat dissipating plate 10. However, the present invention is not limited to this; the recess 13 may be formed into a through hole.

Further, in the present embodiment, the case where only one recess 13 is formed at a portion corresponding to one side of the case 11 has been described, but the present invention is not limited to this configuration. The recesses 13 may be formed in a plurality of places. For example, the recesses 13 may preferably be formed at locations corresponding to the four corners of the case 11. By providing the recesses 13 at the four corners of the case 11 where stress concentration is likely, the stress relaxation effect of the sealing resin 12 can be further improved.

Further, in the present embodiment, it is preferable that the sealing resin 12 and the adhesive B are made of the same resin material. Further, the elastic modulus of the sealing resin 12 is preferably larger than that of the adhesive B. For example, it is preferable that the filler content of the sealing resin 12 is higher than that of the adhesive B. More preferably, the sealing resin 12 and the adhesive B are the same epoxy resin, and the filler content of the sealing resin 12 is higher than that of the adhesive B. Here, the adhesive B may not contain a filler. With this configuration, the adhesive strength between the sealing resin 12 and the adhesive B is high, and the sealing resin is harder and less likely to be deformed than the adhesive B, so that the peeling prevention effect can be further enhanced.

Next, a method of manufacturing the semiconductor module according to the present embodiment will be described with reference to FIGS. 1A-1B and 3A-3D. FIGS. 3A-3D are diagrams schematically showing a method for manufacturing the semiconductor module. The semiconductor module manufacturing method shown below is merely an example, and is not limited to this configuration and can be changed as appropriate. Further, the order of the steps constituting the method for manufacturing the semiconductor module can be changed as appropriate as long as there is no contradiction. Further, the method for manufacturing the semiconductor module may include steps other than the steps shown below.

As shown in FIGS. 1A-1B and 3A-3D, the manufacturing method of the semiconductor module 1 includes a chip placement step (see FIG. 3A), an insulating substrate placement step (see FIG. 3B), a case joining step (see FIG. 3C), a wiring step (see FIG. 3D), and a sealing step (see FIG. 1A), which are carried out in this order.

Figure 3A:
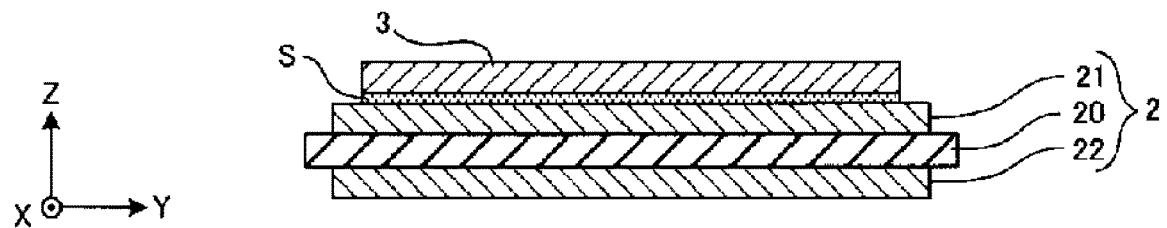
FIGS. 3A-3D are schematic diagrams showing a manufacturing method of the semiconductor module of the embodiment of the present invention.

First, the chip placement step is carried out. As shown in FIG. 3A, in the chip placement step, the semiconductor element 3 is disposed on the upper surface of the circuit board 21 via a bonding material S such as solder. The bonding material S is not limited to solder, and a sintered material can also be used. The bonding material S is heated by being put into a furnace at a predetermined temperature, for example, to join the insulating substrate 2 and the semiconductor element 3.

Figure 3B:
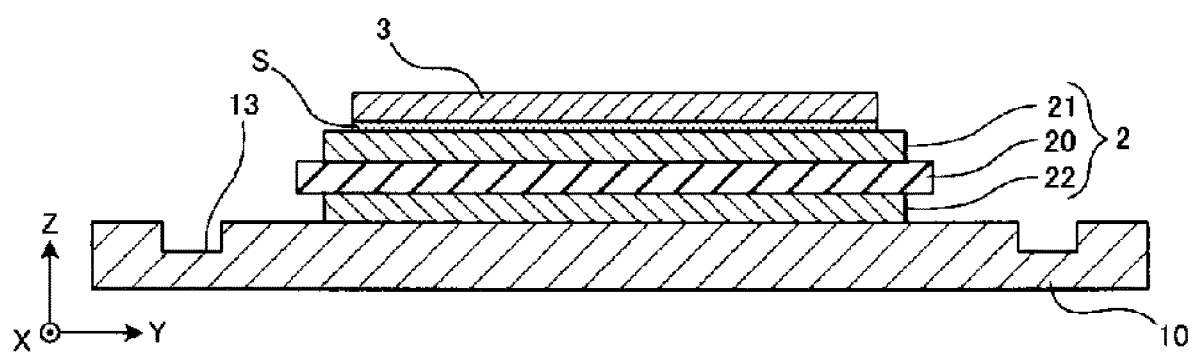

Next, the insulating substrate placement step is carried out. As shown in FIG. 3B, the insulating substrate 2 is disposed on the upper surface of the heat dissipating plate 10 via a bonding material (not shown) such as solder. At this time, the metal plate 22 is directed toward the lower surface side, and the circuit plate 21 is directed toward the upper surface side. Further, the insulating substrate 2 is arranged at a position where it does not overlap with the recesses 13. The bonding material is heated by being put into a furnace at a predetermined temperature, for example, to join the insulating substrate 2 and the heat dissipating plate 10.

Figure 3C:
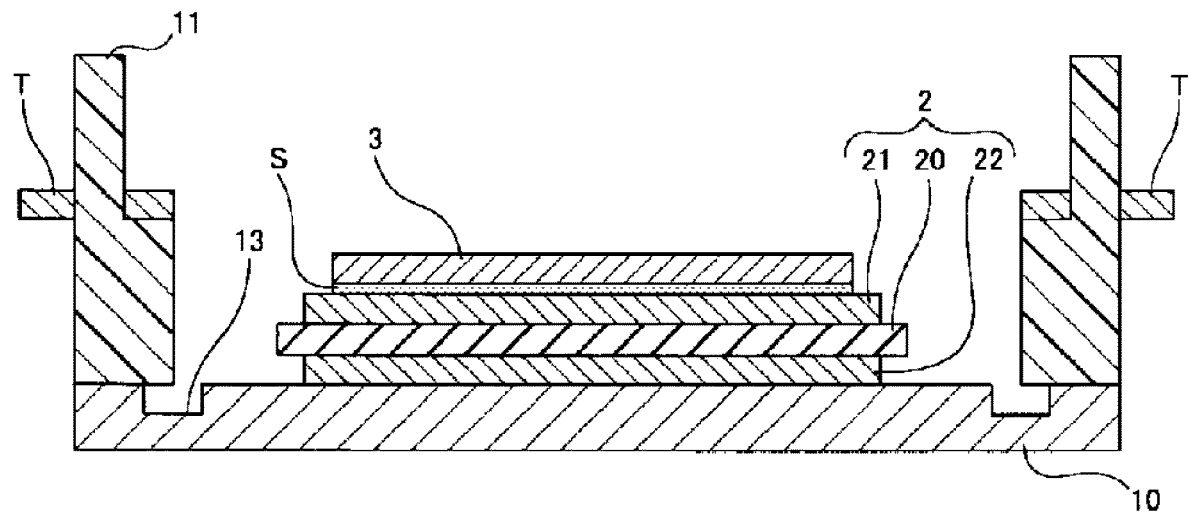

Next, a case joining step is carried out. As shown in FIG. 3C, in the case joining step, the frame-shaped case 11 is arranged so as to surround the outer periphery of the insulating substrate 2. The case 11 is arranged on the outer peripheral side of the heat dissipating plate 10 and the insulating substrate 2 via the adhesive B (see FIG. 1B). Here, the inner peripheral end of the case 11 is arranged so as to straddle a part of the recess 13. The adhesive B is cured to join the heat dissipating plate 10 and the case 11.

Figure 3D:
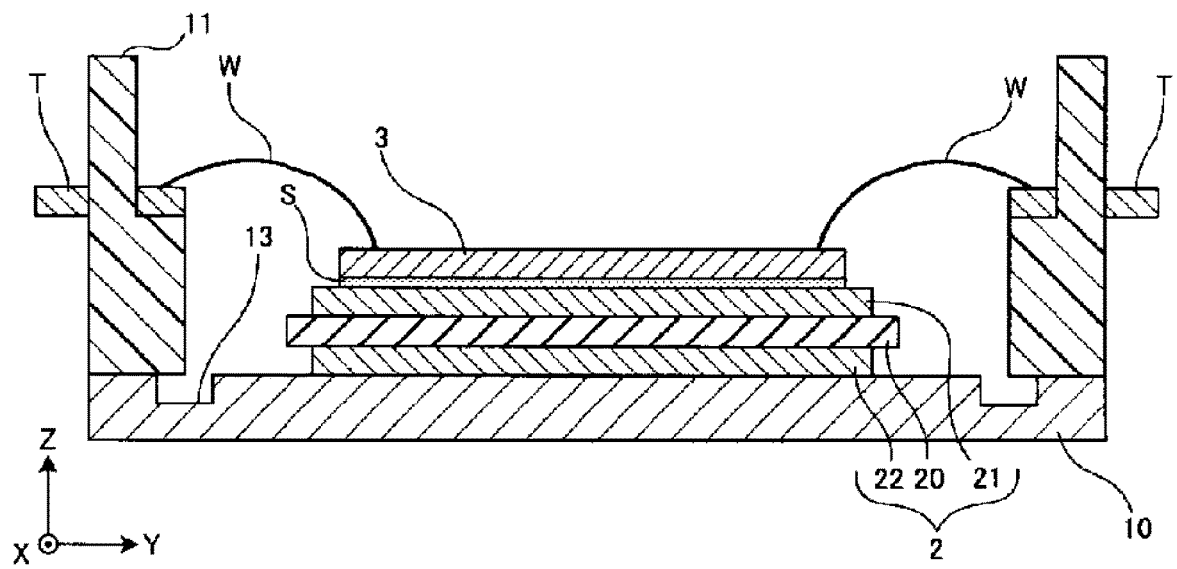

Next, the wiring process is carried out. As shown in FIG. 3D, in the wiring process, the semiconductor element 3 and the terminal members T are electrically connected via wiring members W such as wires. For example, electrodes (top electrodes) formed on the upper surface of the semiconductor element 3 and terminal members T are respectively connected by bonding wires. Alternatively, the circuit board 21 and the terminal member T may be connected by the wiring member W.

Next, a sealing step is carried out. As shown in FIGS. 1A-1B, in the sealing step, the sealing resin 12 is filled in the space (inner space) surrounded by the case 11. The sealing resin 12 is filled to a height near the upper end of the case 11. The sealing resin 12 is also filled in the recess 13. The sealing resin 12 is formed by curing a liquid resin at a predetermined temperature. As a result, at least the insulating substrate 2 and the semiconductor element 3 are covered (sealed) with the sealing resin 12. Further, the wiring member W such as a wire and a part of the terminal member T may be sealed with the sealing resin 12. The sealing resin 12 enhances the bonding force between the heat dissipating plate 10 and the case 11. This way, the semiconductor module 1 is manufactured.

As described above, in the present embodiment, the recess 13 is formed at the interface between the heat dissipating plate 10 and the case 11, and the recess 13 is filled with the sealing resin 12. With this configuration, it is possible to suppress the occurrence of cracks on the end face of the case and extend the life of the semiconductor module 1.

Next, modification examples of the embodiment of the present invention will be described with reference to FIGS. 4A to 12. In the following modifications, only the configuration of the recess 13 is different, and only the different portions will be mainly described. The common configuration will be designated by common reference numerals and the description thereof will be omitted whenever appropriate.

Figure 4A:
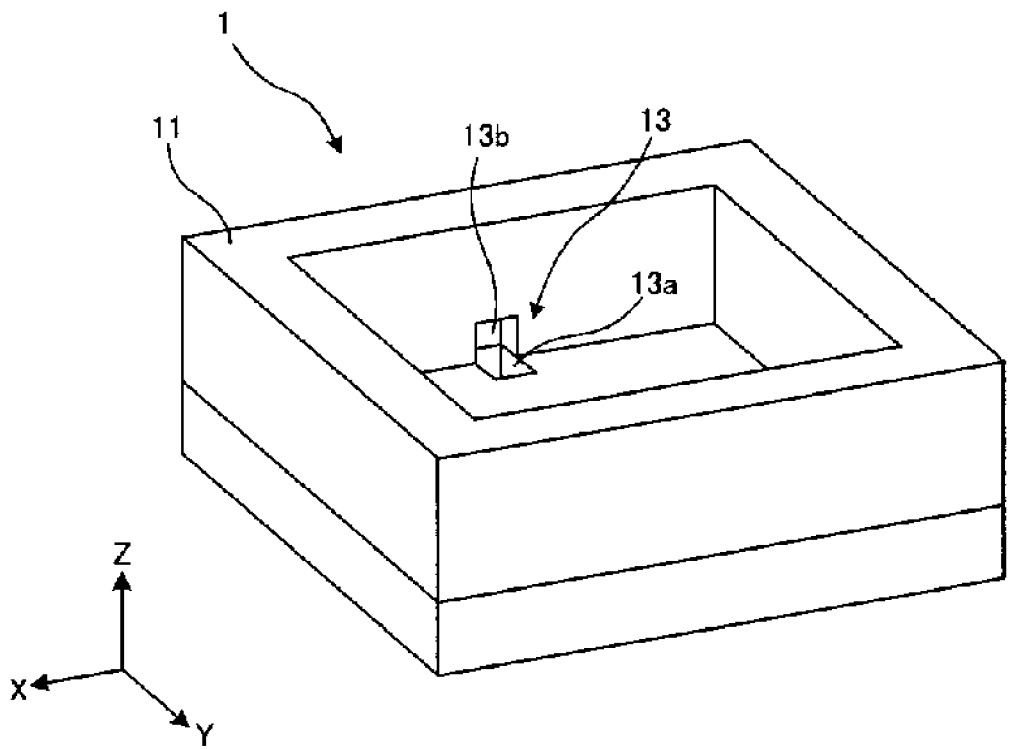
FIGS. 4A-4B are perspective views of a semiconductor module according to the 1st modification of the embodiment of the present invention.
Figure 4B:
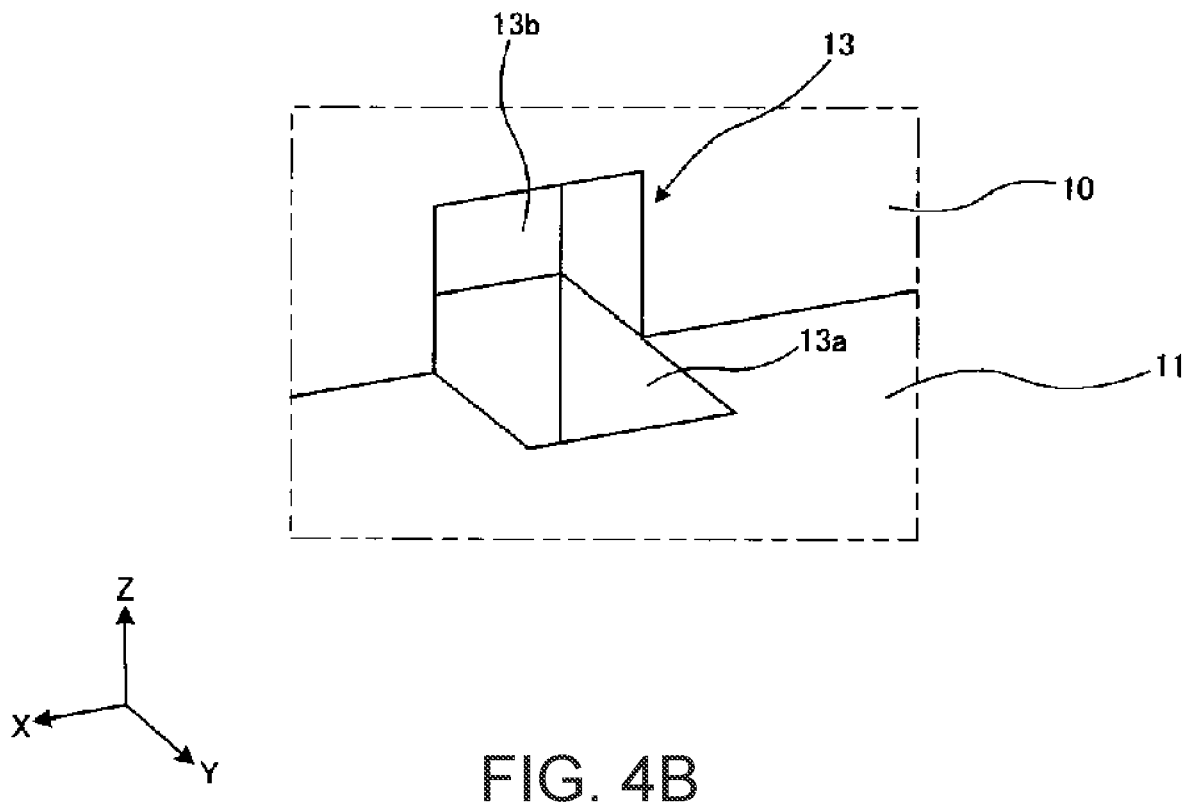
Figure 5:
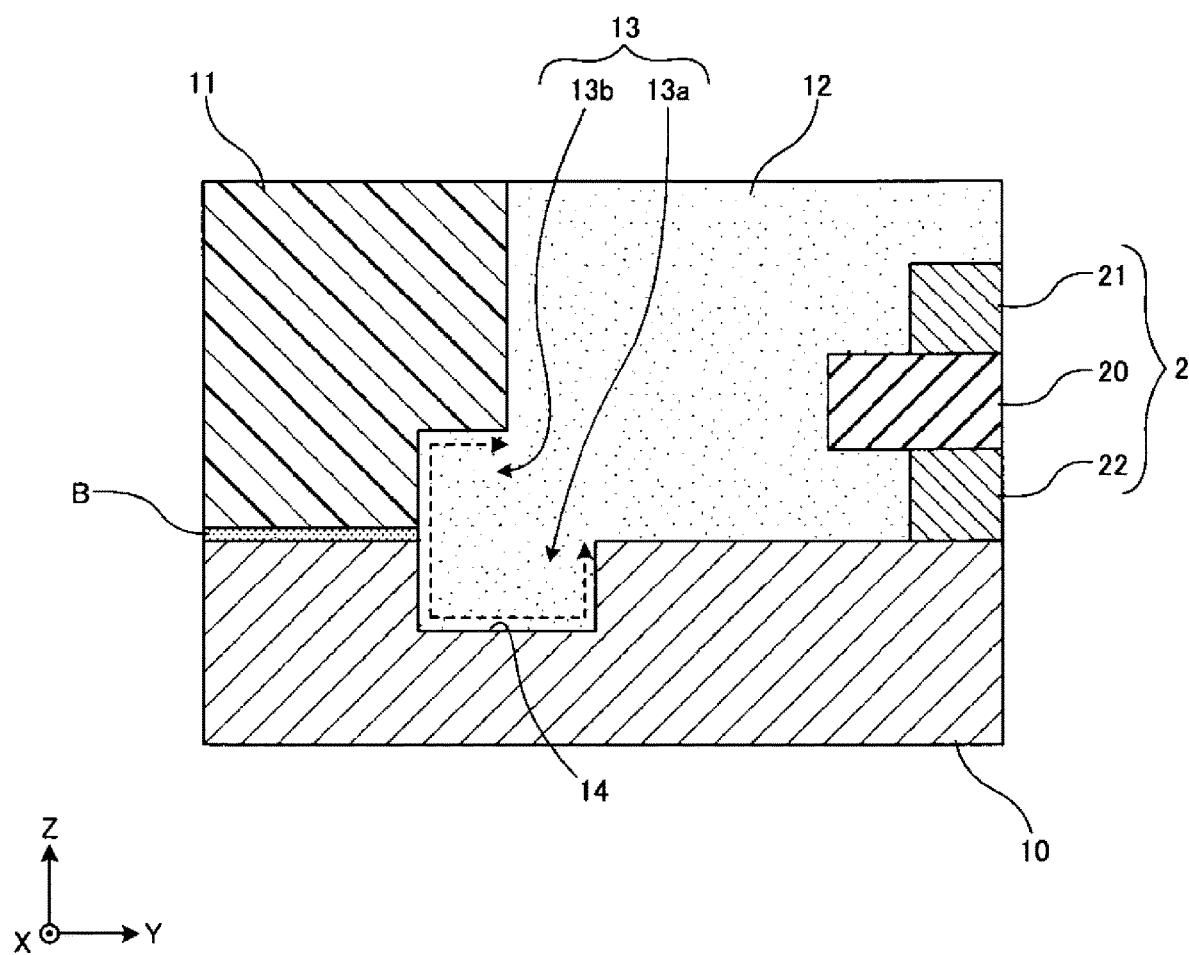
FIG. 5 is a cross-sectional view of the semiconductor module according to the 1st modification of the embodiment of the present invention.

The first modification will be described with reference to FIGS. 4A-4B and 5. In the above embodiment, the recess 13 was formed only on the heat dissipating plate 10 side, but in this first modification, the heat dissipating plate 10 and the case 11 jointly form the recess 13. Specifically, as shown in FIGS. 4A-4B and 5, the recess 13 is composed of a first recess 13a formed on the heat dissipating plate 10 side and a second recess 13b formed on the case 11 side.

That is, the recess 13 is formed into a substantially rectangular parallelepiped shape by way of the heat dissipating plate 10 and the case 11 jointly. Further, the first recess 13a and the second recess 13b are arranged so as to overlap each other in a plan view. Since the heat dissipating plate 10 and the case 11 jointly form the recess 13, the area of the interface 14 in contact with the sealing resin 12 is expanded on both the heat dissipating plate 10 side and the case 11 side. Therefore, it is possible to further improve the adhesion between the heat dissipating plate 10 and the case 11—i.e., the anchor effect between the heat dissipating plate 10 and the case 11.

Figure 6A:
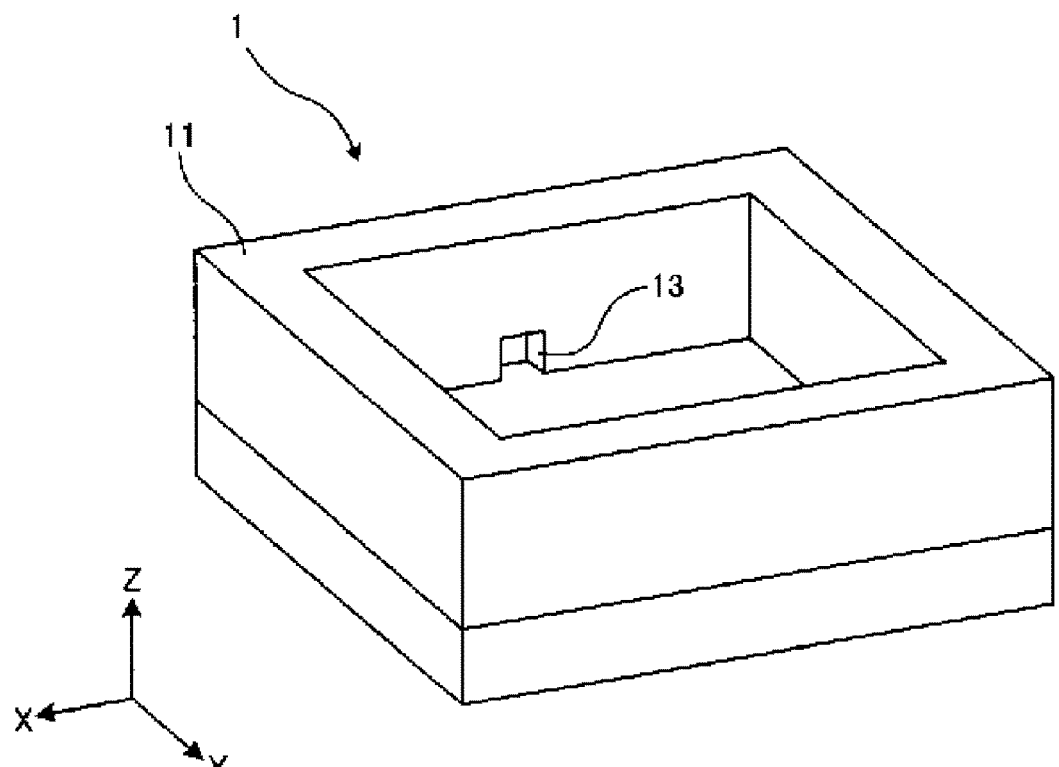
FIGS. 6A-6B are perspective views of a semiconductor module according to the 2nd modification of the embodiment of the present invention.
Figure 6B:
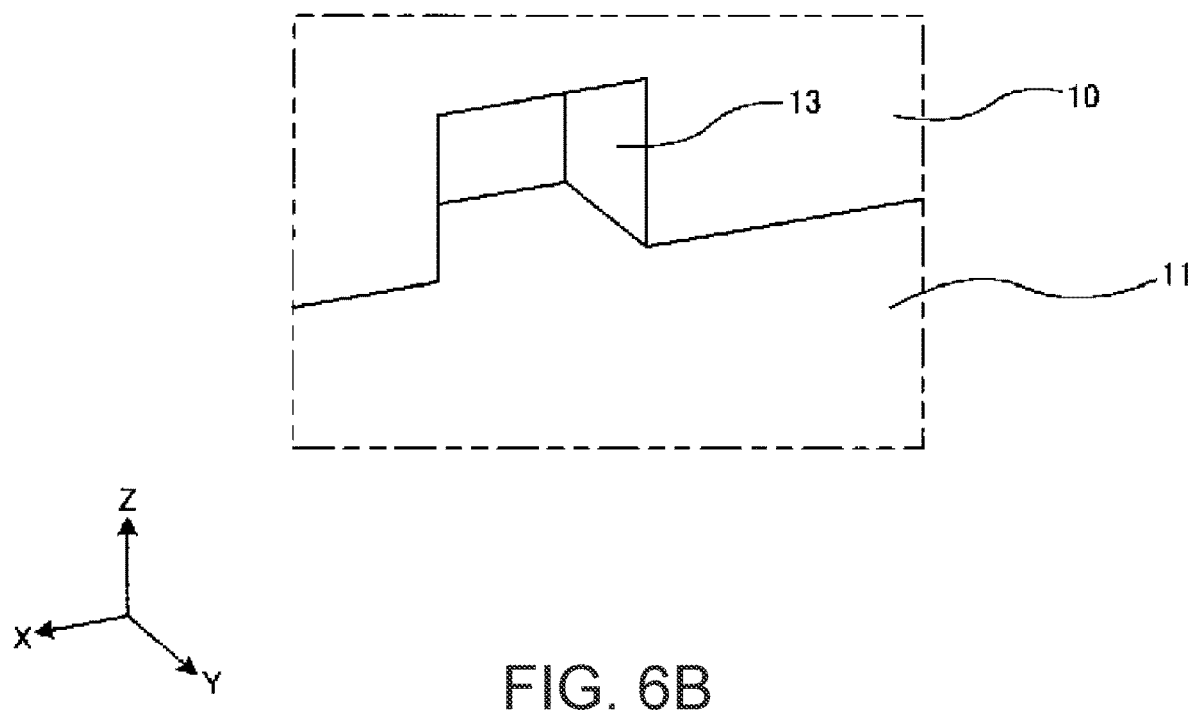
Figure 7:
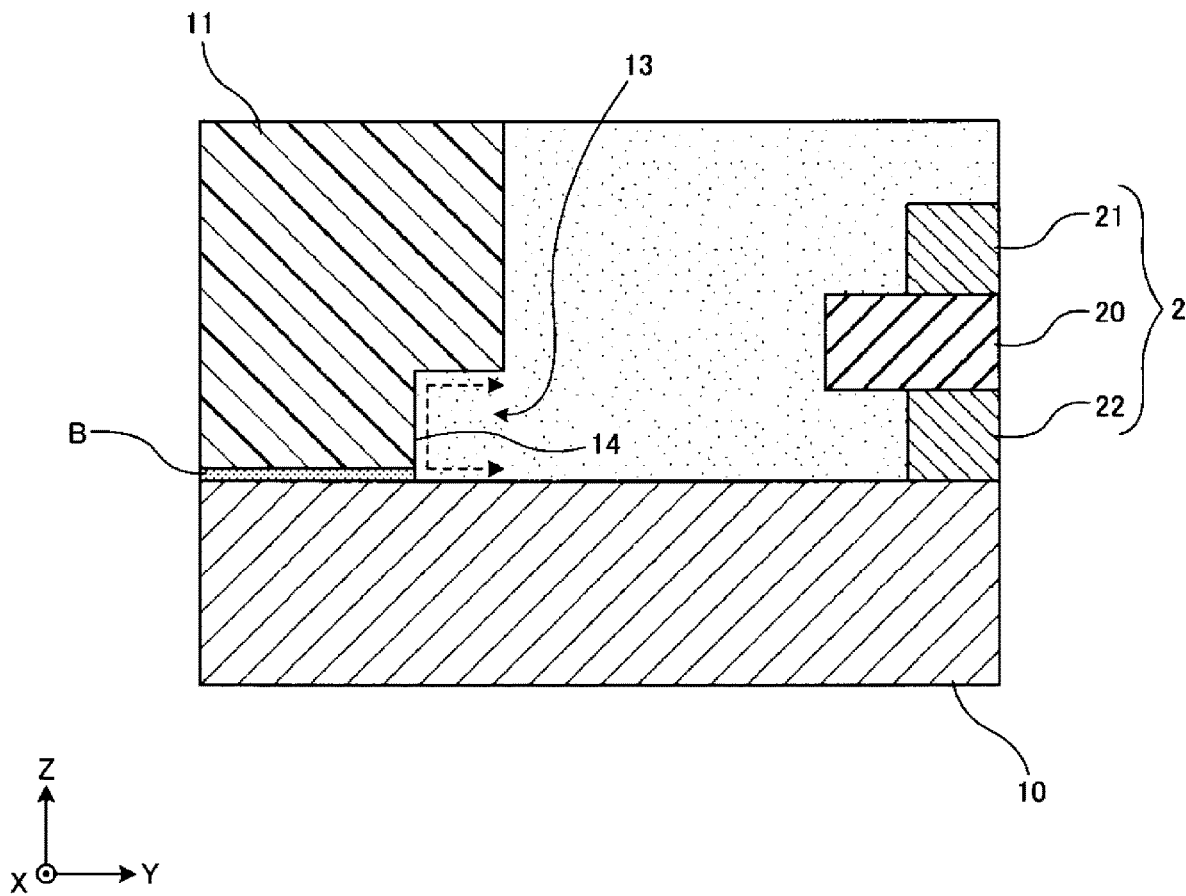
FIG. 7 is a cross-sectional view of the semiconductor module according to the 2nd modification of the embodiment of the present invention.

Next, a second modification of the embodiment will be described with reference to FIGS. 6A-6B and 7. The second modification differs from the previous embodiments in that the recess 13 is formed only on the case 11 side. Specifically, as shown in FIGS. 6A-6B and 7, the recess 13 is formed so as to be recessed in the case 11 at the interface between the heat dissipating plate 10 and the case 11. More specifically, the recess 13 is formed in a part of the inner peripheral edge of one side of the bottom surface forming the frame-shaped case 11 so as to be recessed respectively from the bottom surface and the inner peripheral surface toward the upper surface and the outer periphery of the case 11. Even with such a configuration, it is possible to improve the above-mentioned anchor effect. Further, in the second modification, the anchor effect can be obtained only by changing the shape of the case 11, and therefore, the design is simple and easy.

Figure 8A:
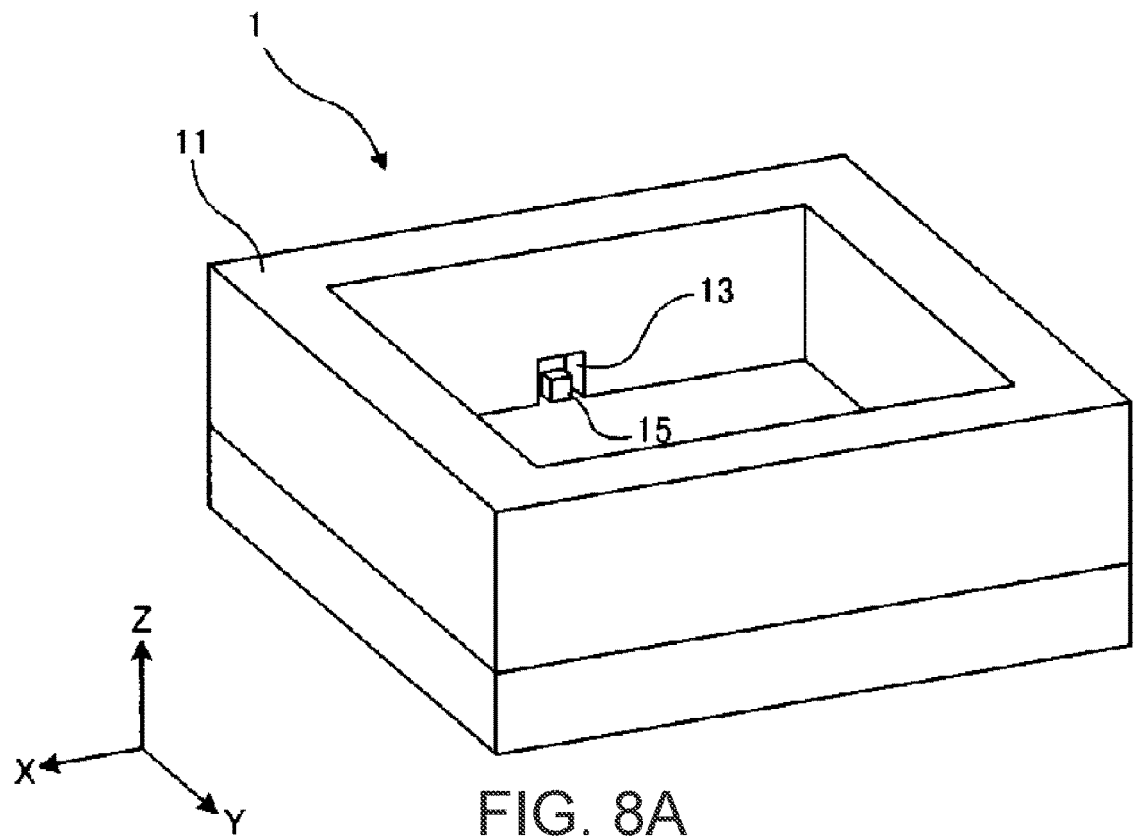
FIGS. 8A-8B are perspective views of a semiconductor module according to the 3rd modification of the embodiment of the present invention.
Figure 8B:
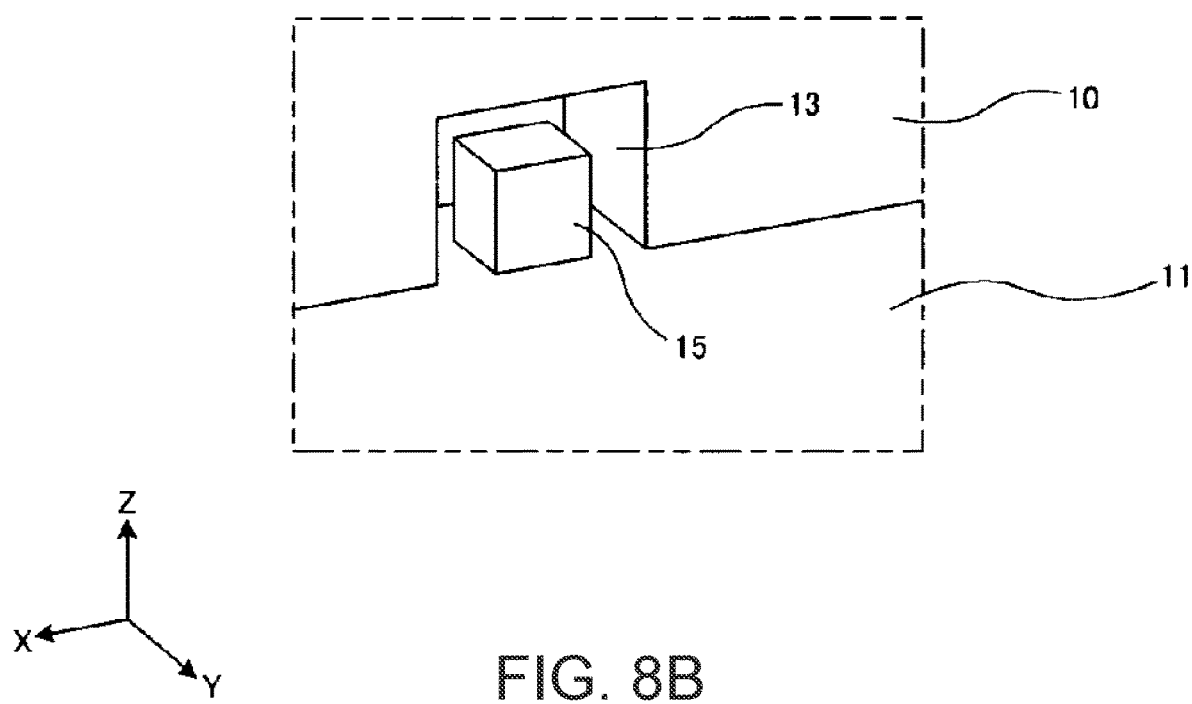
Figure 9:
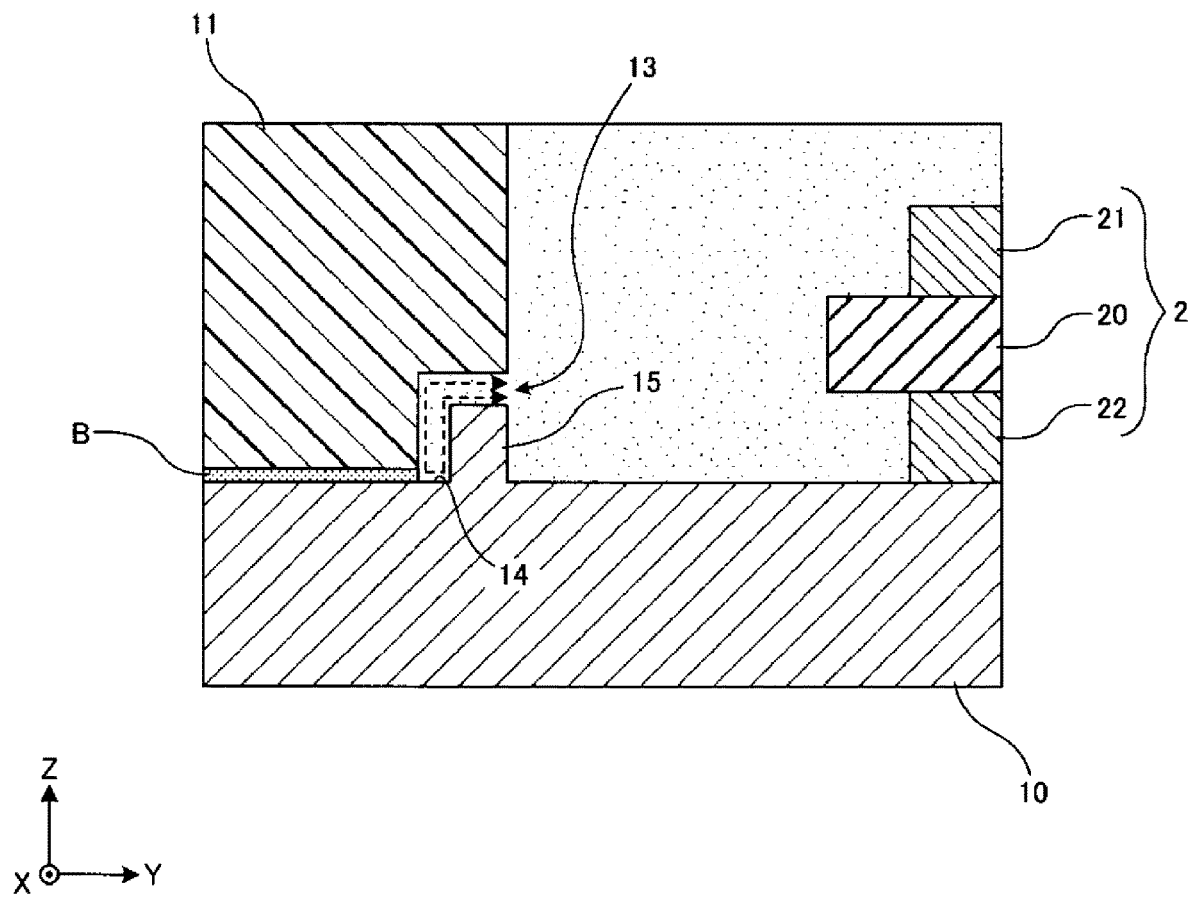
FIG. 9 is a cross-sectional view of the semiconductor module according to the 3rd modification of the embodiment of the present invention.

Next, a third modification of the embodiment will be described with reference to FIGS. 8A-8B and 9. The third modification differs from the embodiments above in that the convex portion 15 is formed in the recess 13 formed on the case 11 side. Specifically, as shown in FIGS. 8A-8B and 9, the recess 13 is formed so as to be recessed on the case 11 side at the interface between the heat dissipating plate 10 and the case 11. Further, inside the recess 13, a convex portion 15 that protrudes from the heat dissipating plate 10 is formed.

The convex portion 15 is formed so as to project upward from the upper surface of the heat dissipating plate 10 into the recess 13. A predetermined gap is provided between the recess 13 and the convex portion 15. The convex portion 15 has a rectangular parallelepiped shape, for example, as shown in FIG. 8B. In this case, a predetermined gap is provided between the three side surfaces and the upper surface of the convex portion 15 and the recess 13. In particular, as shown in FIG. 9, a predetermined gap is preferably provided between the side surface (XZ surface) on the negative the Y direction side of the convex portion 15 and the side surface (XZ surface) on the positive Y direction side of the recess 13 facing the convex portion 15. By providing a gap between the recess 13 and the convex portion 15 in a deep portion of the recess 13 in this way, when the sealing resin 12 is filled in the gap, the adhesion between the case 11 and the heat dissipating plate 10 is further improved.

The convex portion 15 is not limited to this, and may have a cylindrical shape or a polygonal shape. The sealing resin 12 is filled in the gap between the recess 13 and the convex portion 15. Since the area of the interface 14 between the sealing resin 12 and the heat dissipating plate 10 and the case 11 is further secured by the recess 13 and the convex portion 15, a further anchoring effect is obtained. In this third modification, the recess 13 may be formed on the heat dissipating plate 10 side, and the convex portion 15 protruding from the case 11 side may be formed in the recess 13 instead.

Figure 10A:
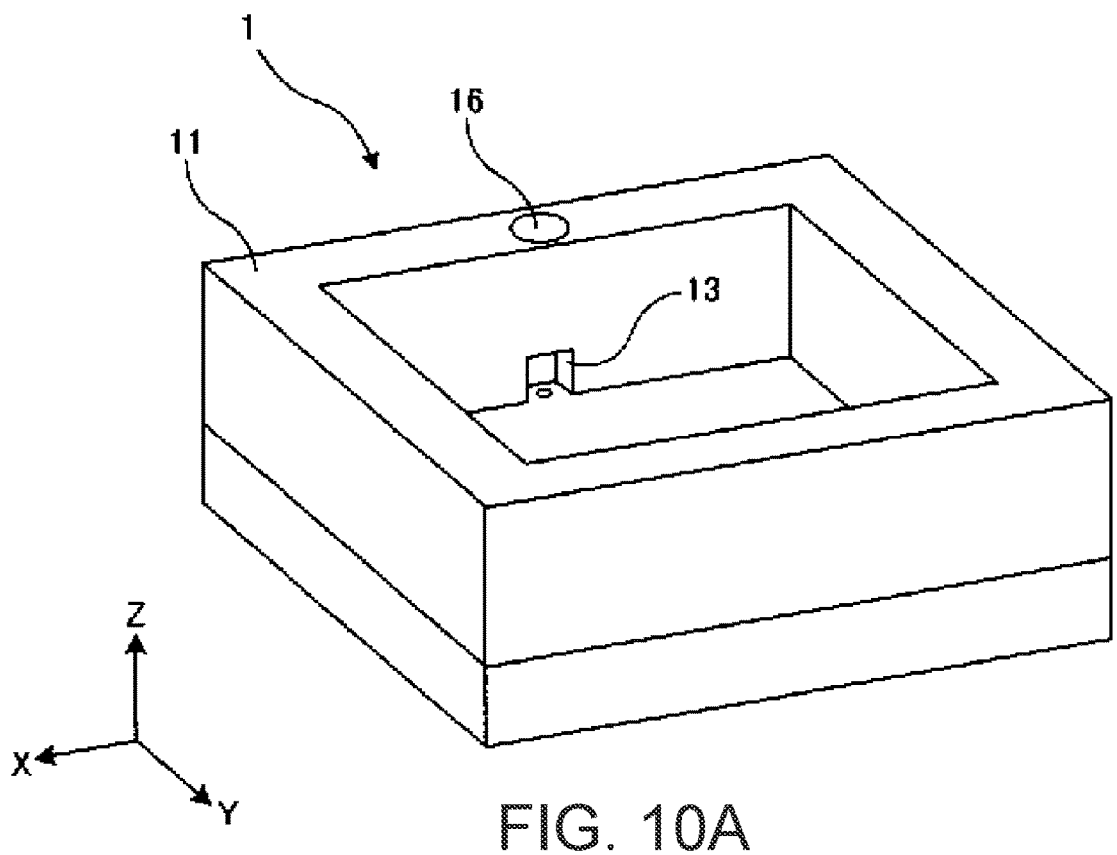
FIGS. 10A-10B are perspective views of a semiconductor module according to the 4th modification of the embodiment of the present invention.
Figure 10B:
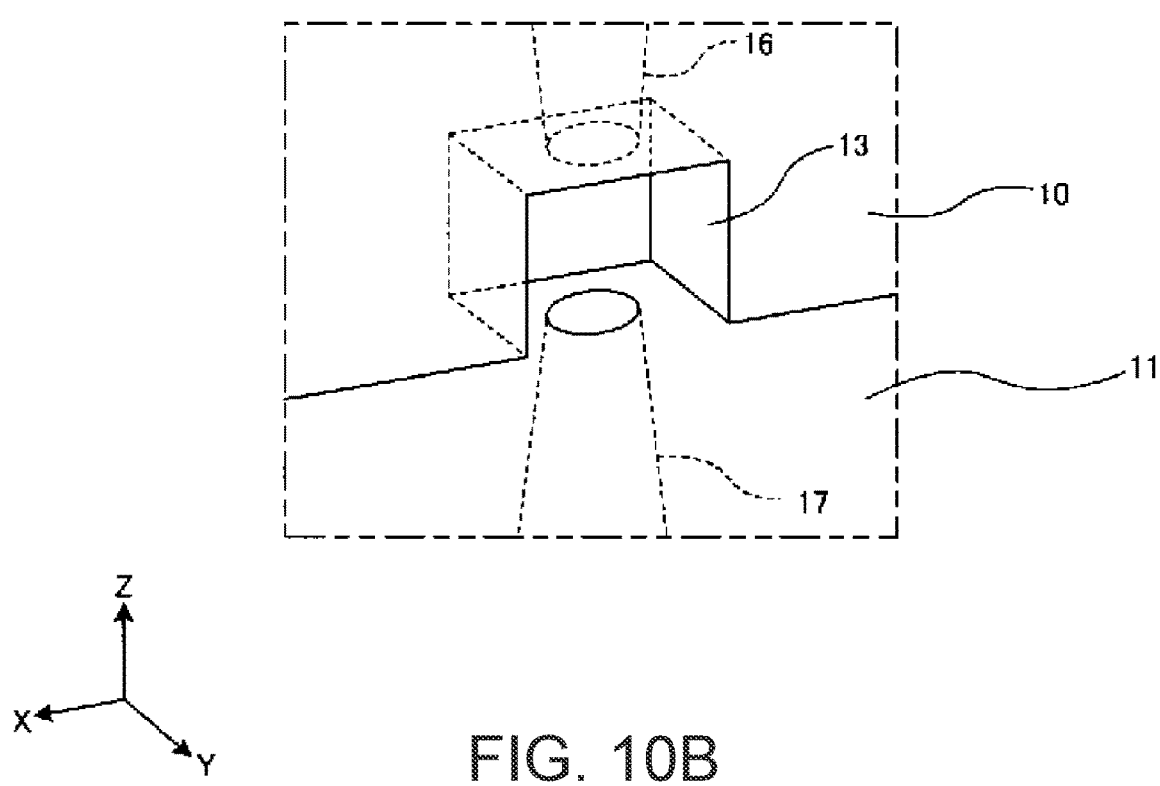
Figure 11:
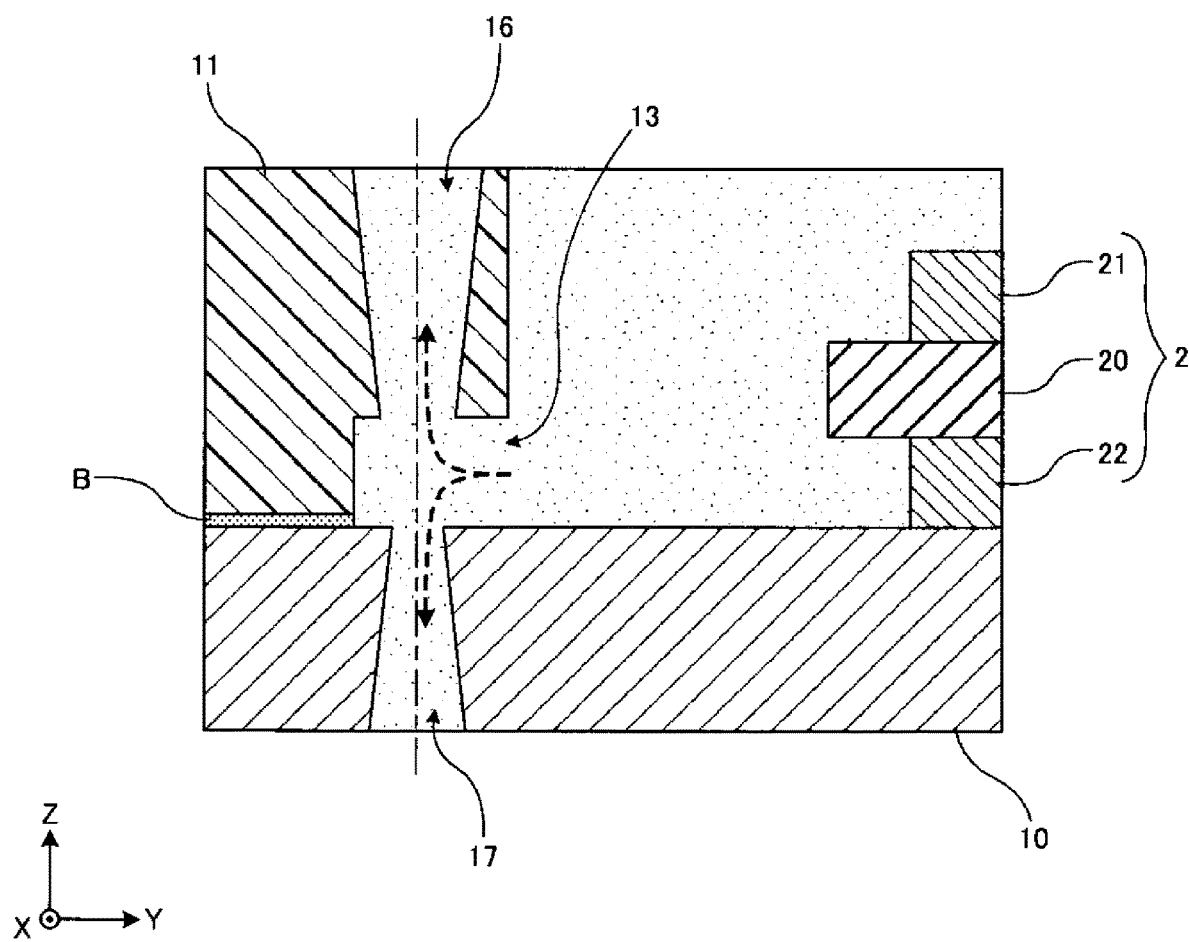
FIG. 11 is a cross-sectional view of the semiconductor module according to the 4th modification of the embodiment of the present invention.

Next, the fourth and fifth modifications of the embodiment will be described with reference to FIGS. 10A to 12. The fourth and fifth modifications differ from the embodiments above in that through holes are formed above and below the recess 13. Specifically, as shown in FIGS. 10A-10B and 11, the recess 13 is formed so as to be recessed into the case 11 at the interface between the heat dissipating plate 10 and the case 11. The recess 13 may be formed so as to be recessed into the heat dissipating plate 10 instead.

The case 11 has a first through hole 16 that is connected to (i.e., communicating with) the upper end of the recess 13 and penetrates the case 11 in the vertical direction. The opening diameter of the first through hole 16 is larger on the upper end side than on the lower end side. More specifically, the first through hole 16 has a tapered shape whose diameter increases from the lower end side toward the upper end side. As shown in FIGS. 10A-10B and 11, it may have a truncated cone shape in which the diameter increases from the lower end side toward the upper end side.

Further, the heat dissipating plate 10 has a second through hole 17 that is connected to the lower end of the recess 13 and penetrates the heat dissipating plate 10 in the vertical direction. The opening diameter of the second through hole 17 is larger on the lower end side than on the upper end side. More specifically, the second through hole 17 has a tapered shape whose diameter increases from the upper end side to the lower end side. As shown in FIGS. 10A-10B and 11, it may have a truncated cone shape in which the diameter increases from the upper end side toward the lower end side.

In a plan view, the lower end opening of the first through hole 16 and the upper end opening of the second through hole 17 coincide with each other in position. More preferably, in a plan view, the center of the lower end opening of the first through hole 16 and the center of the upper end opening of the second through hole 17 coincide with each other in position.

In such a configuration, the sealing resin 12 is filled in the recess 13, the first through hole 16, and the second through hole 17. For example, in the sealing step described above, the liquid sealing resin 12 is filled from the central opening of the case 11 and flows into the first through hole 16 and the second through hole 17 via the recess 13. That is, the sealing resin 12 branches up and down from the recess 13 and flows into the end of each through hole. In the cured sealing resin 12, the inner diameters in the first through hole 16 and the second through hole 17 are respectively larger on the end side than on the recess 13 side.

Therefore, even if a force is applied to the case 11 in the direction from the bottom to the top, that is, in the direction away from the heat dissipating plate 10, the movement of the case 11 is restricted by the sealing resin 12 in the first through hole 16 and therefore peeling off from the heat dissipating plate 10 is suppressed. Similarly, even if a force is applied to the heat dissipating plate 10 in the direction from top to bottom, that is, in the direction away from the case 11, the movement of the heat dissipating plate 10 is restricted by the sealing resin 12 in the second through hole 17, and peeling off from the case 111 is suppressed. Further, since the first through hole 16 and the second through hole 17 coincide with each other in position in a plan view, the sealing resin can be smoothly flowed to the first through hole 16 and the second through hole 17, and peeling off can be further suppressed. In this way, the two through holes (first through hole 16 and second through hole 17) further enhance the anchor effect between the heat dissipating plate 10 and the case 11.

In the fourth modification shown in FIGS. 10A-10B and 11, the case where the first through hole 16 and the second through hole 17 are formed in a truncated cone shape has been described, but the present invention is not limited to this configuration. The first through hole 16 and the second through hole 17 may be formed, for example, in the shape of a quadrangular pyramid or other pyramid.

Figure 12:
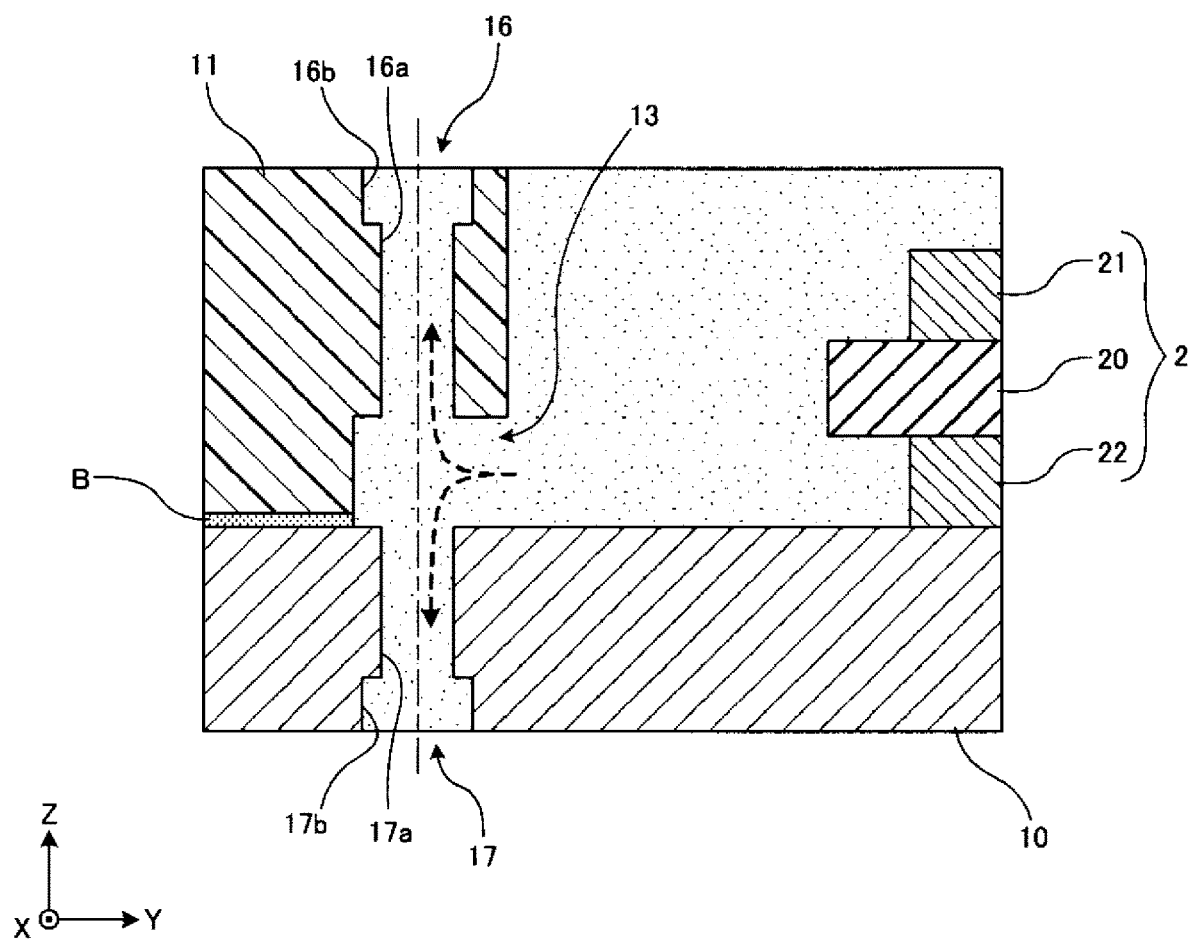
FIG. 12 is a cross-sectional view of a semiconductor module according to the 5th modification of the embodiment of the present invention.

Further, in the fourth modification shown in FIGS. 10A-10B and 11, the tapered shape is formed in which the inner diameters of the first through hole 16 and the second through hole 17 continuously change, but the present invention is not limited to this configuration. In the fifth modification of the embodiment, as shown in FIG. 12, the through hole may have a configuration in which the diameter is stepwise increased. More specifically, in FIG. 12, the first through hole 16 has a narrow hole portion 16a and a diameter-expanded portion 16b, and the second through hole 17 has a narrow hole portion 17a and a diameter-expanded portion 17b.

The narrow hole portion 16a and the diameter-expanded portion 16b of the first through hole 16 may have a cylindrical shape. Further, the narrow hole portion 16a and the diameter-expanded portion 16b of the first through hole 16 may be concentric circles in a plan view. Further, the narrow hole portion 17a and the diameter-expanded portion 17b of the second through hole 17 may have a cylindrical shape. Further, the narrow hole portion 17a and the diameter-expanded portion 17b of the second through hole 17 may be concentric circles in a plan view. Then, in a plan view, the lower end opening of the first through hole 16 and the upper end opening of the second through hole 17 coincide with each other in position. More preferably, in this embodiment, in a plan view, the center of the lower end opening of the first through hole 16 and the center of the upper end opening of the second through hole 17 coincide with each other in position.

The narrow hole portion 16a communicates with the upper end of the recess 13 and extends upward. The diameter-expanded portion 16b having a larger inner diameter is connected to the upper end of the narrow hole portion 16a. Similarly, the narrow hole portion 17a communicates with the lower end of the recess 13 and extends downward. The diameter-expanded portion 17b having a larger inner diameter is connected to the lower end of the narrow hole portion 17a. As described above, even if the inner diameter of the through hole is changed stepwise, the anchor effect between the heat dissipating plate 10 and the case 11 can be improved in a manner similar to the manner described above.

In the fourth modification shown in FIGS. 10A-10B and 11, the case where the first through hole 16 and the second through hole 17 are formed in a truncated cone shape has been described, but the present invention is not limited to this configuration. The first through hole 16 and the second through hole 17 may be formed, for example, in the shape of a quadrangular pyramid or other pyramid.

Although the embodiment and the modified examples thereof have been described, the above-described embodiments and the modified examples may be combined in whole or in part. For example, the features shown in FIGS. 1A to 12 may be combined as appropriate.

Further, the present embodiment is not limited to the above-described embodiments and modifications, and may be variously modified, replaced, or modified without departing from the spirit of the technical idea. Furthermore, if the technical idea can be realized in another way by the advancement of technology or another technology derived from it, it may be carried out by that method. Therefore, claims cover all embodiments and such modifications that may be included within the scope of the technical idea covered by the claims and their equivalents.

Some of the feature points in the above embodiments may be summarized below.

A semiconductor module in one aspect of the present invention includes: a heat dissipating plate; an insulating substrate disposed on an upper surface of the heat dissipating plate; a semiconductor element disposed an upper surface of the insulating substrate; a frame-shaped case bonded to the upper surface of the heat dissipating plate via an adhesive so as to surround peripheries of the insulating substrate and the semiconductor element; and a sealing resin that fills an inner space defined by the frame-shaped case and the heat dissipating plate so as to seal the insulating substrate and the semiconductor element, wherein at an interface between the heat dissipating plate and the frame-shaped case, a recess communicating with the inner space is formed in at least one of the frame-shaped case and the heat dissipating plate, and the sealing resin is filled in the recess.

In the above-described semiconductor module, the recess may be formed in the upper surface of the heat dissipating plate at a position facing a part of an inner peripheral edge of one side of the frame-shaped case, and may be recessed towards a back surface of the heat dissipating plate.

In the above-described semiconductor module, the recess may be formed in a bottom surface of the frame-shaped case, and may be recessed from the bottom surface and an inner peripheral surface of the frame-shaped case towards an upper surface and an outer periphery of the frame-shaped case in at least one side of the frame-shaped case.

In the above-described semiconductor module, the recess may be formed of: a first recess formed in the heat dissipating plate, and a second recess formed in the framed-shaped case, and the first recess and the second recess may overlap with each other in a plan view.

In the above-described semiconductor module, the recess may be formed in a bottom surface of the frame-shaped case, and a convex portion protruding from the heat dissipating plate may be disposed in the recess with a predetermined gap provided between the recess and the convex portion, and the sealing resin may be filled in the predetermined gap.

In the above-described semiconductor module, the frame-shaped case may have a through hole that communicates with the recess and penetrates the frame-shaped case in a vertical direction, the through hole having a larger opening diameter on an upper end side than on a lower end side, and the sealing resin may be filled in the through hole in the frame-shaped case.

In the above-described semiconductor module, the through hole in the frame-shaped case may have a tapered shape whose diameter increases from the lower end side towards the upper end side.

In the above-described semiconductor module, the heat dissipating plate may have a through hole that communicates with the recess and penetrates the heat dissipating plate in a vertical direction, the through hole having a larger opening diameter on a lower end side than on an upper end side, and the sealing resin may be filled in the through hole in the heat dissipating plate.

In the above-described semiconductor module, the through hole in the heat-dissipating plate may have a tapered shape whose diameter increases from the upper end side towards the lower end side.

In the above-described semiconductor module, the through hole in the frame-shaped case and the through hole in the heat dissipating plate may be arranged so as to coincide with each other in position in a plan view.

In the above-described semiconductor module, the sealing resin may completely fill in an entire interior of the recess.

In the above-described semiconductor module, an elastic modulus of the sealing resin may be larger than that of the adhesive.

In the above-described semiconductor module, a filler content of the sealing resin may be larger than that of the adhesive.

In another aspect of the present invention, a method for manufacturing a semiconductor module including a heat dissipating plate, an insulating substrate disposed on an upper surface of the heat dissipating plate, and a semiconductor element disposed on an upper surface of the insulating substrate includes: a case joining step of bonding a frame-shaped case to the upper surface of the heat dissipating plate so as to surround the insulating substrate and the semiconductor element via an adhesive; and a sealing step of filling an inner space defined by the frame-shaped case and the heat dissipating plate with a sealing resin so as to seal the insulating substrate and the semiconductor element, wherein at an interface between the heat dissipating plate and the frame-shaped case, a recess communicating with the inner space is formed in at least one of the frame-shaped case side and the heat dissipating plate, and the sealing resin is filled in the recess in the sealing step.

As described above, the present invention has the effect of suppressing the occurrence of cracks on the end face of the case and achieving a long life, and is particularly useful for semiconductor modules and methods for manufacturing semiconductor modules.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor module, comprising:
   a heat dissipating plate;
   an insulating substrate disposed on an upper surface of the heat dissipating plate;
   a semiconductor element disposed an upper surface of the insulating substrate;
   a frame-shaped case bonded to the upper surface of the heat dissipating plate via an adhesive so as to surround peripheries of the insulating substrate and the semiconductor element; and
   a sealing resin that fills an inner space defined by the frame-shaped case and the heat dissipating plate so as to seal the insulating substrate and the semiconductor element,
   wherein at an interface between the heat dissipating plate and the frame-shaped case, a recess communicating with the inner space is formed in at least one of the frame-shaped case and the heat dissipating plate, and the sealing resin is filled in the recess, and
   wherein the recess is formed in the upper surface of the heat dissipating plate at a position facing a part of an inner peripheral edge of one side of the frame-shaped case, and is recessed towards a back surface of the heat dissipating plate.

2. The semiconductor module according to claim 1, wherein the sealing resin completely fills in an entire interior of the recess.

3. The semiconductor module according to claim 1, wherein an elastic modulus of the sealing resin is larger than that of the adhesive.

4. The semiconductor module according to claim 1, wherein a filler content of the sealing resin is larger than that of the adhesive.

5. The semiconductor module according to claim 1, wherein the sealing resin is in contact with a bottom surface of the frame-shaped case in the recess.

6. The semiconductor module according to claim 1, wherein a depth of the recess is larger than a thickness of the adhesive.

7. The semiconductor module according to claim 1, wherein the recess is formed at each of locations corresponding to four corners of the frame-shaped case.

* * * * *